United States Patent [19]

Miyazaki

[11] Patent Number: 5,111,461
[45] Date of Patent: May 5, 1992

[54] COMMUNICATION CONTROL SYSTEM

[75] Inventor: Takeshi Miyazaki, Tokyo, Japan

[73] Assignee: Hitachi, Ltd., Tokyo, Japan

[21] Appl. No.: 508,391

[22] Filed: Apr. 11, 1990

Related U.S. Application Data

[63] Continuation of Ser. No. 198,518, May 25, 1988, Pat. No. 4,939,741.

[30] Foreign Application Priority Data

May 27, 1987 [JP] Japan .................................. 62-128196

[51] Int. Cl.⁵ .............................................. G06F 11/10
[52] U.S. Cl. .................................................... 371/37.1
[58] Field of Search ................... 371/37.1, 37.6, 38.1, 371/39.1, 40.1, 47.1, 49.1; 370/99, 108; 375/118, 108

[56] References Cited

U.S. PATENT DOCUMENTS

| | | | |
|---|---|---|---|
| 3,227,999 | 1/1966 | Hagelbarger | 371/37.1 X |
| 3,475,724 | 10/1969 | Townsend et al. | 371/37.1 X |
| 4,397,020 | 8/1983 | Howson | 371/37.1 X |
| 4,447,902 | 5/1984 | Wilkinson | 371/37.1 X |
| 4,593,393 | 6/1986 | Mead et al. | 371/37.1 |
| 4,644,543 | 2/1987 | Davis, Jr. | 371/37.1 |
| 4,700,350 | 10/1987 | Douglas et al. | 371/37.1 |
| 4,809,273 | 2/1989 | Jackowski et al. | 371/37.1 X |

FOREIGN PATENT DOCUMENTS 58-201446 11/1983 Japan .
61-228749 10/1986 Japan .
62-116019 5/1987 Japan .

OTHER PUBLICATIONS

"µPD72001 User's Manual", pp. 161-165, published by NEC, 1986 (translation included).

Primary Examiner—Robert W. Beausoliel
Attorney, Agent, or Firm—Fay, Sharpe, Beall, Fagan, Minnich & McKee

[57] ABSTRACT

In a serial communication unit having a CRC calculator or in a single-chip micro-computer including the serial communication unit, the CRC calculator is operated in synchronism with a system clock which is different from and asynchronous with respect to a reception clock. As a result, the CRC calculation is prevented from being stopped by the interruption of the reception clock, or the CRC calculation by the software is unnecessitated, thereby improving the communication efficiency.

9 Claims, 4 Drawing Sheets

COMMUNICATION CONTROL SYSTEM

This is a continuation of copending application Ser. No. 07/198,518 filed on May 25, 1988 now U.S. Pat. No. 4,939,791.

BACKGROUND OF THE INVENTION

The present invention relates to a communication control technology, and in particular, to a technology effectively applicable to a serial communication apparatus including a calculator effecting a computation of a cyclic redundancy check of received data, for example, in a serial communication system utilizing a modem.

Conventionally, in order to achieve a serial communication between micro-processors, there has been provided a communication LSI such as the μPD72001 of NEC. FIG. 7 shows an example of a system employing the communication LSI, μPD72001. In this configuration, a microprocessor CPU is connected via a system bus BUS to a memory MEM, DMA controller DMAC, and a serial communication LSI SIO. Between the serial communication LSI SIO and a communication line, there is disposed a modem (an encoder, a decoder) to achieve a modulation and a demodulation on the data received and the data to be transmitted and to generate a clock from the received data.

In addition, the communication LSI, μPD72001 is provided with a calculator achieving a CRC calculation on the received data such that the CRC code located at the last portion of the received data is transferred from a shift register in the communication IS to the CRC calculator in response to a clock supplied from the modem MODEM. Furthermore, the CRC calculation for the received data is to be completed when a period of time associated with 16 bits is elapsed after the CRC code in the last location of the received data is received. [For details, refer to pages 161 to 165 of the "μPD72001 User's Manual" published by NEC in 1986.)

In the system above, in order to complete the CRC computation, for example, two-byte dummy data is additionally disposed at the end of the CRC code and then the receive clock must be continuously supplied for a period of time associated with 16 bits after the CRC code is received.

However, in the ordinary modems, there has been adopted a method in many cases in which the reception clock associated with the received data is stopped immediately after the CRC code is received, namely, immediately after the last bit of the received data is received. Consequently, in a case where the reception CRC calculation is to be accomplished by using such a modem described above, two-byte dummy data not related to the received data are required to be additionally located next to the CRC code on the side transmitting the data. As a result, the load on the transmission side is increased.

Furthermore, in a case where the dummy data is not added by the transmission side at the transmission, a microprocessor may achieve the CRC calculation on the received data by use of the software; however, the load on the software is increased, and the CRC calculation must be effected each time a byte of data is received, which leads to a problem that the overhead in the reception is increased.

SUMMARY OF THE INVENTION

It is therefore an object of the present invention to improve the communication efficiency in a communication system between micro-processors by minimizing the overhead in an operation to receive data without increasing the load of the system on the transmission side and the load of the software on the reception side.

Another embodiment of the present invention is to provide a communication control apparatus which can cope with a plurality of communication protocols and which can increase the flexibility of the user system.

Above and other objects and novel features of the present invention will become apparent from the following detailed description taken in conjunction with the accompanying drawings.

Representative features of the present invention disclosed in this specification are as follows.

That is, in a serial communication apparatus, there is provided a CRC calculator so as to be operated in response to a system clock of a micro-processor system on the reception side, and there is further provided a reception clock synchronization circuit so as to synchronize the reception clock with the system clock, thereby operating a shift register associated with the data reception in response to the synchronized clock.

According to the means described above, an operation to shift into the CRC calculator the received CRC code, which can includes error data, in response to the reception clock supplied from the modem is unnecessary. Consequently an interruption of the CRC calculation due to an interruption of the reception clock can be prevented, and an operation on the transmission side to insert the dummy data after the CRC code and the CRC calculation to be carried out by the software of the microprocessor on the reception side becomes unnecessary, which minimizes the overhead when the data is received and the communication efficiency is improved, thereby achieving the object above.

BRIEF DESCRIPTION OF THE DRAWINGS

The present invention will be apparent from the following detailed description taken in conjunction with the accompanying drawings in which.

DESCRIPTION OF THE PREFERRED EMBODIMENTS

Figure 1:
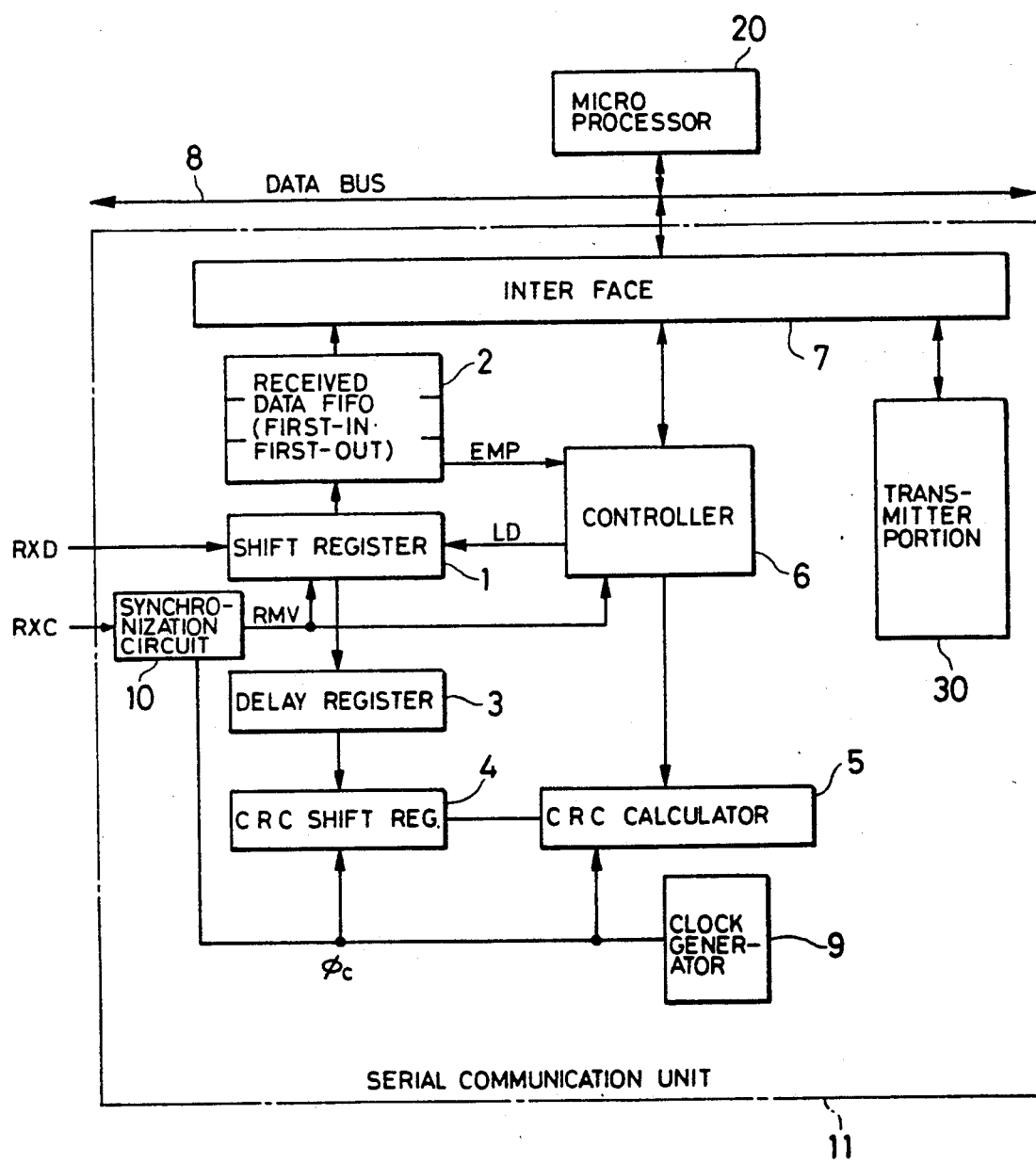
FIG. 1 is a block diagram showing an embodiment of the constitution of a receiving portion when the present invention is applied to a serial communication LSI.

FIGS. 1 to 4 show an embodiment in which the present invention is applied to a serial communication LSI. The communication LSI 11 of this embodiment includes a transmitter portion and a receiver portion and FIG. 1 shows in detail the configuration of the receiver portion. Since the configuration is implemented in an LSI, although not limited to, each circuit block of FIG. 1 is formed on a semiconductor substrate according to the known semiconductor manufacturing technology.

The receiver portion includes a reception shift register 1 which shifts the received serial data in response to a reception clock externally supplied from a modem or the like so as to convert the data in parallel data for each eight bits thereof, an n-stage received data memory 2 (n is an integer) in which the converted reception data RXD is stored, a delay register 3 for generating a period of time to be used to judge whether or not the CRC calculation is to be effected, a CRC shift register 4 to shift the received data RXD into a CRC calculator, a CRC calculator 5 for executing a CRC calculation of the received data, a controller 6 for controlling the overall receiver portion, an interface circuit 7 for effecting an interface with an external data bus 8, and a system clock generator circuit 9 for generating a system cock to be supplied to each portion of the LSI. The receive data memory 2 comprises a memory of a first-in first-out method.

Furthermore, in this embodiment, the shift operation from the CRC shift register 4 into the CRC calculator 5 is to be carried out in synchronism with the system clock $\phi c$ supplied from the clock generator circuit 9, not with the reception clock RXC.

In addition, in order to fetch the received data into the reception shift register 1, a synchronization circuit 10 is disposed in the input port of the reception clock RXC synchronized with the received data RXD supplied from a modem or the like. The synchronization circuit 10 is to be supplied with the system clock $\phi c$ from the clock generator circuit 9 such that the reception clock RXC is synchronized with one of a plurality of system clocks $\phi c$. (Refer to FIG. 3(A) to FIG. 3(C) for details.) The synchronized clock RMV is further supplied to the reception shift register 1 so as to shift the received data RXD into the internal circuit for a shift operation.

Furthermore, the serial communication LSI of this embodiment is configured so as to effect the send and receive operations according to a purality of communication protocols such as a protocol of the byte synchronization type and the high-level data link control (HDLC). When receiving data according to a protocol such as the HDLC, the received data is sequentially transferred to and is stored in the data FIFO 2 in a unit of a byte, and each byte is directly transferred from the reception register 1 to the CRC register 4 without using the delay register 3 so as to effect the CRC calculation for all bytes.

Figure 6:
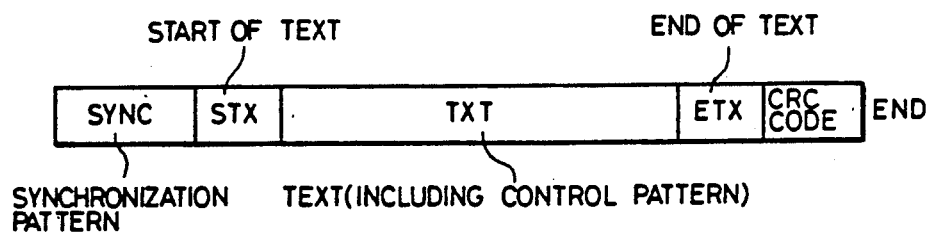
FIG. 6 is an explanatory diagram useful to explain a frame constitution example of each reception data according to protocol of a byte synchronization type (BISYBC)
Figure 7:
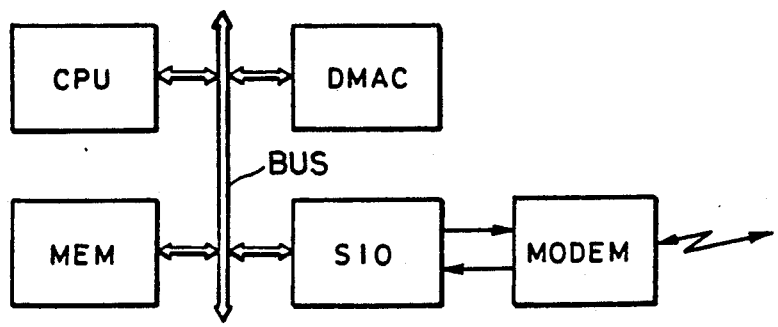
FIG. 7 is a block digram showing a constitution example of a micro-computer system employing a serial communication LSI.

On the other hand, when receiving data according to a protocol of the byte synchronization type, the CRC calculation is not achieved for the control pattern contained in the text field TXT of the communication data format of FIG. 6.

In this case, consequently, the received data converted by the reception shift register 1 into parallel data is immediately transferred via the reception data FIFO 2 and the interface circuit 7 to the data bus 8. At the same time, the received data fetched into the reception shift register 1 is also transferred therefrom to the delay register 3. Thereafter, during a period of time in which the next received data is transferred from the reception shift register 1 to the delay register 3, the micro-processor 20 fetches the received data from the data bus 8 to judge whether or not the pertinent data is to be included in the data of the object of the reception CRC calculation, thereby supplying an instruction via the data bus to the communication LSI.

Consequently, in this case, the data FIFO 2 does not operate as an FIFO circuit, namely, the fetched data is immediately delivered via the interface circuit 7 to the data bus 8.

When the micro-processor 20 determines as a result of the judgment that the CRC calculation is to be effected on the received data, a CRC calculation execute command is sent to the controller 6, which in turn decodes the command so as to cause the delay register 3 to transfer the received data to the CRC shift register 4 and further to shift the data into the CRC calculator 5, thereby executing the CRC calculation. On the other hand, when the micro-processor 20 determines that the reception CRC calculation is not to be effected, the CRC calculation execute command is not supplied to the controller 6, and hence the transfer operation from the delay register 3 to the CRC shift register 4 is not achieved.

Figure 2:
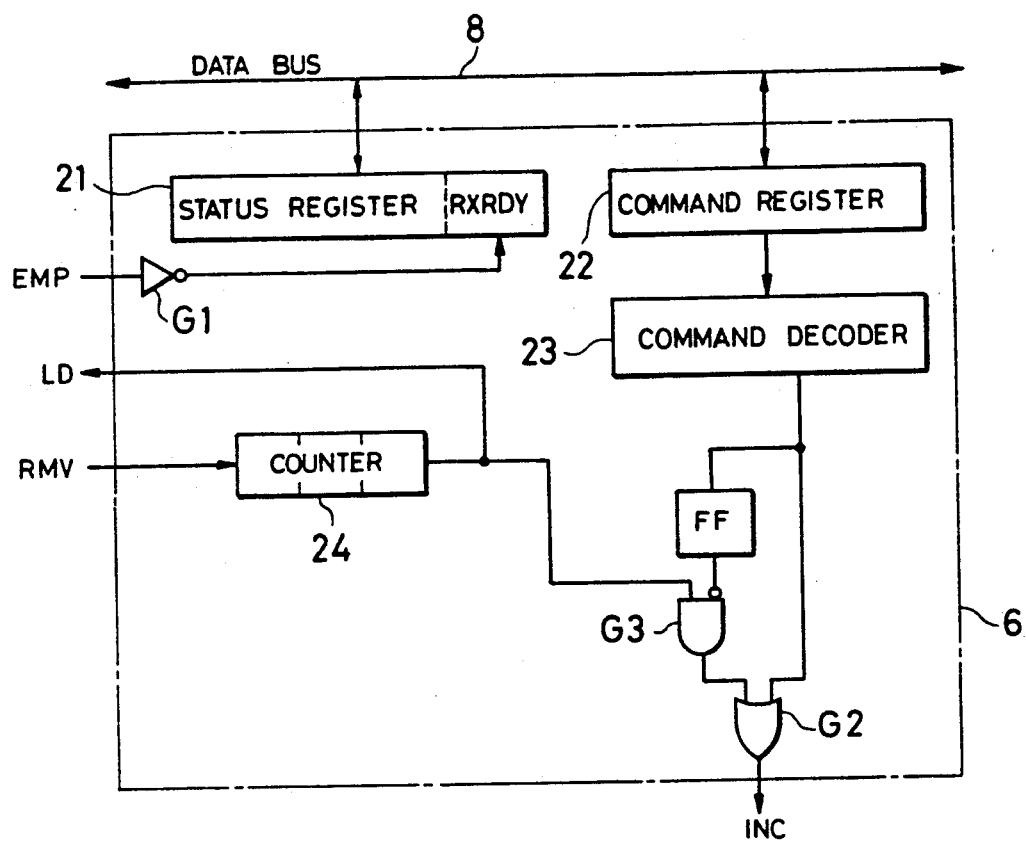
FIG. 2 is a block diagram showing a configuration example of a control portion supervising the control of the overall receiving portion.
Figure 3A:
FIG. 3(A) to FIG. 3(C) are timing charts showing relationships between the system clock and the reception clock.
Figure 3B:
Figure 3C:
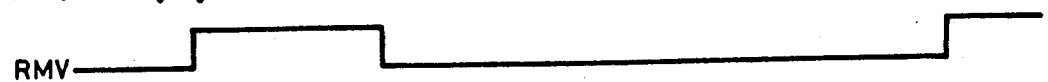

FIG. 2 shows an example of the controller 6 on the receiver side supervising the control of the overall receiver portion.

The controller 6 on the receiver portion of this embodiment includes a status register 21 reflecting the operation state of the receiver portion, a set of registers such as a command register 22 to keep a command supplied from the micro-processor 20, and the like. The status register 21 includes a bit RXRDY indicating whether or not the FIFO 2 contains a byte of received data. The bit RXRDY is set to 0 or 1 by supplying a store state signal EMP outputted from the reception data FFO and transmitted via an inverter G1 when the FIFO 2 is empty or contains received data, respectively.

When "1" is set to the bit RXRDY, the condition that data is stored in the FIFO 2 is notified via an internal interruption signal line to an interruption controller of the micro-processor 20, thereby causing an internal interruption in the micro-processor 20. Alternatively, in place of the configuration employing the occurrence of an internal interruption, the system may be configured such that the microprocessor 20 periodically attempts to read the content of the status register 21 according to the polling method, thereby detecting whether or not the FIFO 2 is empty. When the microprocessor 20 reads data from the FIFO 2 and the FIFO 2 becomes to be empty as a result, a signal EMP causes the bit RXRDY to be cleared to "0". Incidentally, in addition to the bits RXRDY, there are disposed a bit indicating whether or not the received data FIFO 2 is full of data, a bit denoting whether or not a CRC error has occurred, and the like.

On the other hand, the command register 22 is loaded with a command such as a "CRC calculation forcible execution" instruction, a "CRC calculation omission" instruction, or the like supplied from the micro-processor 20. The command is then decoded by a command decoder 23 so as to form control signals for the respective circuit blocks in the receiver portion.

When the command register 22 is loaded with a "CRC calculation forcible execution" instruction, the command decoder 23 produces a CRC calculation start or initiate signal INC, which is then supplied via an OR gate G2 to the CRC calculator 5.

Furthermore, the receiver controller 6 of this embodiment includes a 3-bit counter 24, which counts the cock RMV generated by the synchronization circuit 10. When an overflow occurs in the 3-bit counter 24, a signal BCE is produced as an output. The signal BCE is supplied as a transfer signal LD to the shift register 1, which in turn transfers the content thereof to the received data FIFO 2. The shift register 1 comprises eight bits so as to fetch and to shift the received data RXD in response to the clock RMV. Consequently, if the transfer signal LD is received when one byte of the received data is stored in the shift register 1, one byte of the received data is transferred therefrom to the received data FIFO 2 in a parallel operation.

On the other hand, the signal BCE outputted when an overflow occurs in the counter 24 is supplied as a CRC calculation start signal via an AND gate G3 and the OR gate G2 to the CRC calculator 5. Consequently, in the communication controller of this embodiment, also in a case where the "CRC calculation forcible execution" command is not issued from the micro-processor, the CRC calculation start signal is outputted from the counter 24 to the CRC calculator 5 when one byte of data is received by the shift register 1. However, in order to prevent a contention of CRC calculation start signals from the command decoder 23 and the counter 24, there is disposed a flip-fop FF to latch a signal generated by decoding the "CRC calculation forcible execution" command. According to an output signal from the flip-flop FF, the AND gate G3 is controlled. Namely, once the CRC calculation start signal INC is delivered from the command decoder 23, the flip-flop FF is set so as to close the AND gate G3 by the output therefrom, which of consequence prevents the CRC calculation start signal produced by the counter 24 from being supplied to the CRC calculator 5.

Moreover, also in a case where a "CRC calculation omission" command is supplied from the micro-processor 20 to the command register 22, the flip flop FF is caused to be set so as to prevent CRC calculation start signal produced by the counter 24 from being supplied to the CRC calculator 5.

According to the embodiment above, the CRC shift register 4 and the CRC calculator 5 are configured to operate in response to the system clock $\phi c$ generated by the system clock generator circuit 9. As a result, in a case where the reception clock is interrupted at the end of the data reception, namely, even when the reception clock RXC is interrupted in a state in which the data is completely loaded in the shift register 1, if the program is beforehand prepared such that the "CRC calculation forcible execution" command is issued from the micro-processor 20 to the controller 6 on the receiver side, the received data can be supplied, by use of the system clock $\phi c$, via the delay register 3 and the CRC shift register 4 to the CRC calculator 5, thereby effecting the reception CRC calculation.

That is, in the conventional communication LSI (for example, $\mu$PD72001), since the CRC calculator 5 is operated depending on the reception clock, if the reception clock RXC is interrupted in the state in which the data is entirely loaded in the shift register 1, the CRC calculation cannot be achieved on the received data stored in the shift register 1. According to the embodiment above, however, due to the adoption of a method in which the CRC calculation is accomplished by use of the system clock $\phi c$, the CRC calculation is not interrupted.

In addition, without supplying a "CRC calculation forcible execution" command from the micro-processor 20 to the controller 6 on the receiver side, the CRC calculation signal is automatically outputted from the counter 24 when the next byte of data is completely received so as to execute the CRC calculation based on the system clock. In consequence, the program need not necessarily issue the CRC calculation command.

Furthermore, also in a system in which the reception clock continues after the reception of a frame of data, since the CRC calculation can be executed by supplying a "CRC calculation forcible execution" command to the controller 6 prior to the reception of the next byte of data, the period of time required for the CRC calculation is minimized. That is, ordinarily, in a micro-computer having a serial communication function, the frequency of the system clock $\phi c$ is set to be higher than that of the reception clock RXC. As a result, by operating the CRC calculator with the system clock, not with the reception clock, the speed of the CRC calculation can be increased even in a system in which the reception clock continues after the reception of a frame of data.

Furthermore, according to the method in which the CRC calculation is initiated with an overflow signal associated with a counter, the CRC calculation is commenced after a completion of a reception of the next one byte of data, namely, with a delay of one byte. However, when the communication controller according to the present invention is used and if a "CRC calculation forcible execution" command is issued without waiting for the overflow of the counter 24 operated in response to the clock RMV having the same frequency as the reception clock, the CRC calculation can be earlier completed.

Moreover, in a data reception, like in the BISYNC protocol, in which data has a field not included in the CRC calculation, when data not included in the CRC calculation is received, if a "CRC calculation omission" command is supplied for each byte of the data from the micro-processor to the controller 6 on the receiver side, the CRC can be temporarily stopped so as to easily omit the pertinent data from the object of the CRC calculation.

Figure 4:
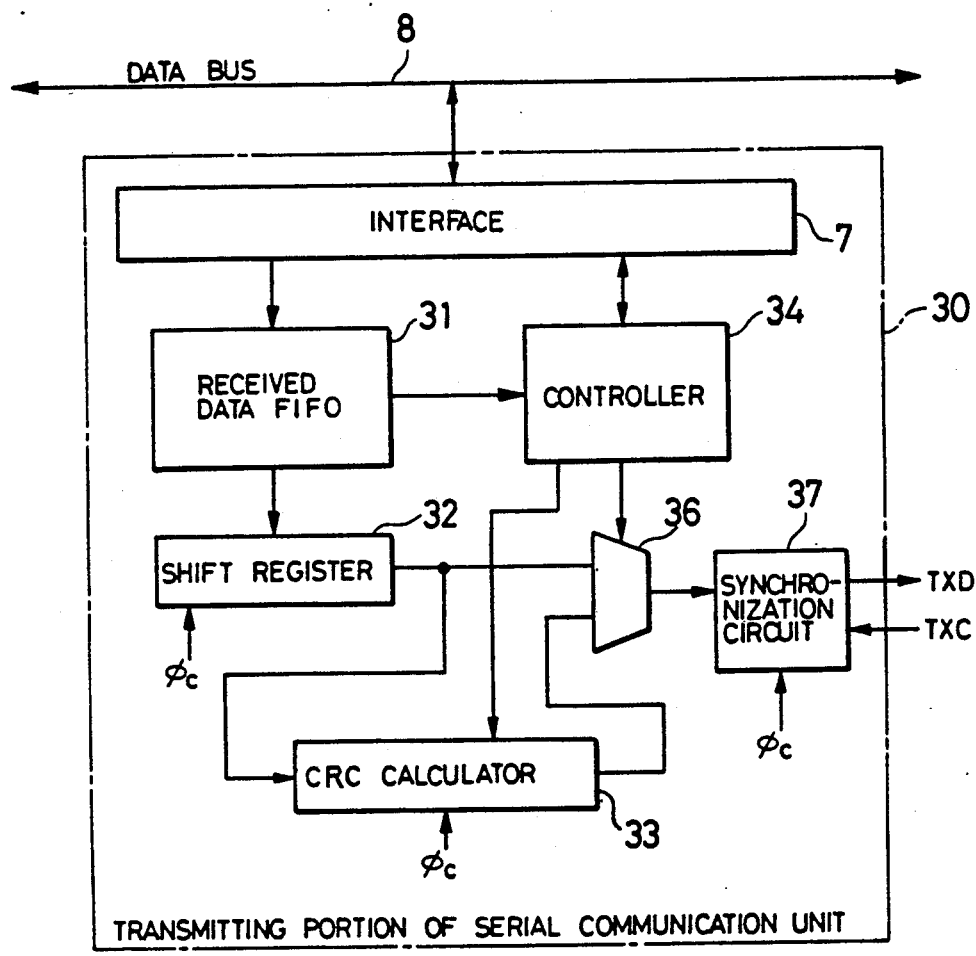
FIG. 4 is a block diagram showing a constitution example of a transmission portion.

Incidentally, although the embodiment has been described in conjunction with details about the receiver portion of the serial communication control unit, the transmitter portion is also configured in a almost similar fashion. Namely, as shown in FIG. 4, the transmitter portion 30 includes a tranmission or received data FIFO 31, a transmission shift register 32 for effecting a parallel-to-serial conversion on the transmission data, a CRC calculator for computing a CRC code of the transmission data, and a controller 34 on the transmitter side for controlling the respective circuit blocks. The transmission data FIFO 31 and the controller 34 on the transmission side are connected via the interface 7 to the data bus 8. However, the status register 21 may be commonly used for the transmission controller 34 and the reception controller 6.

The transmission data converted into serial data by the shift register 21 is sent via a multiplexer 36 to a synchronization circuit 37, which in turn outputs the data to an external device in synchronism with a transmission clock TXC supplied from a modem or the like. Thereafter, in the multiplexer 36, the CRC code calculated by the CRC calculator 33 is added at the end of a frame of transmission data TXD so as to transmit the resultant data.

The respective circuit blocks of the transmitter portion 30 are configured, like the components of the receiver portion, so as to be operated in synchronism with the system clock φc. However, there exists a difference that in contrast with the receiver portion, the transmitter portion 30 may include the circuits blocks to be operated in synchronism with the transmission clock. In this case, there does not arise any trouble.

In addition, according to the embodiment above, the clock generator circuit 9 used to generate the system cock φc is integrally disposed in the communication controller. However, the clock of the micro-processor may be used as the system clock, namely, the system can be configured such that the clock supplied from the clock generator circuit in the microprocessor used for the system clock or that a clock generated by an external device is supplied to the micro-processor and the communication controller.

Furthermore, although only one system cock φc is shown in this embodiment, the circuit blocks may naturally be operated with system cocks which are associated with at least two phases and which have the same frequency or the different frequencies.

Figure 5:
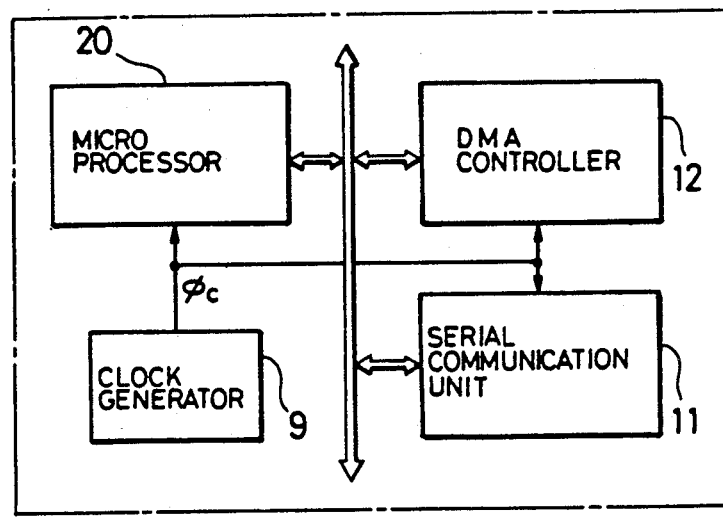
FIG. 5 is a bock diagram showing a configuration example of a single-chip micro-computer in which a microprocessor, a DMA controller, and a serial communication unit are integrally formed in a unit.

FIG. 5 shows a configuration example of a single-chip micro-computer with a serial communication function in which the serial communication unit 11 constituted as described in conjunction with the embodiment above is formed on a Chip together with the micro-processor 20 and the direct memory access (DMA) controller 12. In this single-chip microcomputer, the system clock φc fed from the clock generator 9 to the micro-processor 20 is also supplied as the system clock to effect the reception CRC calculation to the serial communication unit 11 such that the CRC shift register and the CRC calculator are operated with the cock, thereby preventing the interruption of the CRC calculation due to the interruption of the reception cock. As a result, the load that the dummy data is required to be added on the transmitter side is unnecessitated. Furthermore, on the receiver side, the micro-processor need not effect the CRC calculation by use of the software.

In addition, according to the second embodiment, by use of the DMA controller 12, the received data can be directly transferred through a DMA transfer from the data FIFO of the serial communication unit 11 to an external memory.

According to the present invention, there are attained the following effects. Namely, since the serial communication apparatus is provided with a CRC calculator and the CRC calculator is configured so as to be operated in synchronism with the system clock of the microcomputer on the receiver side, the received CRC code need not be shifted into the CRC calculator in response to the reception clock supplied from the modem, which as a result prevents the CRC calculation from being interrupted by the interruption of the reception clock. At the same time, the operation achieved on the transmitter side to add dummy data after the CRC code and the CRC calculation conducted in the microprocessor on the receiver side by use of the software becomes unnecessary. Consequently, without increasing the load of the system on the transmitter side and the load of the software on the receiver side, the communication efficiency can be improved by minimizing the overhead associated with the reception of data.

Furthermore, since the receiver portion is configured such that the calculation start signal is generated for each reception of a byte of data and that the CRC calculation is executed or is interrupted when the receiver portion receives a "CRC calculation forcible execution" command or a "CRC calculation omission" command, respectively, the system can cope with a plurality of communication protocols and the the application of the user system can be broady expanded.

While the present invention has been concretely described with reference to the embodiments, it is not restricted by those embodiments. It is to be understood that the embodiments can be changed and modified without departing from the scope and spirit of the present invention. For example, in the description of the embodiments above, the received data is passed from the data FIFO 2 via the interface circuit 7 to the micro-processor 20 in the data reception; however, there may be disposed, in addition to the data FIFO 2, an FIFO to store status information indicating the reception state for each received data such that a frame of status information is passed to the micro-processor 20 at the completion of the data reception. Moreover, in place of the FIFO, a 1-byte register may be employed.

Although the present invention mainly has been described in a case where the present invention is applied to a serial communication LSI constituting a communication system between micro-processors which is the utilization field as the background of the present invention, the present invention is not restricted by the serial communication LSI and can be generally utilized in apparatuses for transferring data to which the CRC code is added.

What is claimed is:

1. In a serial communication system including a data transmission device for providing at least one piece of serial data, along with a reception clock, and a data reception device coupled to receive the serial data containing error detection data and a signal from the reception clock, the data reception device comprising:
    a reception circuit including a storing means coupled to receive the serial data and for storing the received serial date therein in response to the signal from the reception clock;
    a calculator coupled to receive the error detection data from the reception circuit, the calculator being responsive to a predetermined clock signal and a control signal for starting a calculation of the received error detection data;
    a clock generator coupled to the calculator for providing the predetermined clock signal;
    a microprocessor for providing a command indicative of a start of the calculation in the calculator; and,
    command decoder means coupled to receive the command for providing the control signal to the calculator, whereby the calculation continues even during the interruption of the signal from the reception clock, the signal being interrupted upon a completion of reception of the serial data.

2. The data reception device of claim 1 wherein the data reception device is configured in a semiconductor device.

3. The data reception device of claim 1 wherein frequency of the predetermined clock signal is set to be higher than that of the reception clock.

4. The data reception device of claim 1 wherein the microprocessor is coupled to the clock generator, and wherein the microprocessor is operated in response to the predetermined clock signal.

5. The data reception device according to claim 1 further comprising:
   a data bus coupled to the microprocessor, the reception circuit and the command decoder means;
   a memory coupled to the data bus; and,
   a DMA controller coupled to the data bus for effecting a transfer of data stored in the reception circuit to the memory according to a DMA transfer method.

6. The data reception device according to claim 5 wherein the reception circuit, the calculator, the clock generator, the microprocessor, the command decoder means, the data bus, and the DMA controller are on a semiconductor chip.

7. The data reception device according to claim 1 wherein the reception circuit includes a shift register for fetching the serial data therein by a shift operation which is responsive to the reception clock, and first-in, first-out (FIFO) memory coupled to an output of the shift register for storing output data of the shift register therein.

8. A communication controller for receiving serial data containing an error detection code and receiving a reception clock synchronized with the serial data, the communication controller comprising:
   reception means coupled to receive the serial data and for storing the serial data therein in response to the reception clock;
   clock generator means for providing a predetermined clock signal;
   calculator means coupled to the reception means for executing a calculation of the error detection code supplied to the calculator means from the reception means in response to the predetermined clock signal, a start of the calculation in the calculator means being controlled by a control signal supplied to the calculator means;
   microprocessor means for providing a command when the microprocessor means determines the calculation is to be effective on the received serial data; and,
   controller means coupled to the microprocessor means and to the calculator means being responsive to the command and for providing the control signal to the calculator means, whereby the calculation in the calculator means continues even during an interruption of the reception clock.

9. A communication system comprising:
   a serial communication unit including a receiver portion which receives serial data containing an error detection code and a reception clock synchronized with the serial data, and a storing means which stores the serial data therein in response to the reception clock, the reception clock being stopped after a completion of a reception of the serial data by the receiver portion, the serial communication unit further including a calculator coupled to the receiver portion for performing a calculation with the error detection code, the calculator being responsive to a predetermined clock signal to execute the calculation of the received error detection code when the serial communication unit receives a command to start of the calculation in the calculator;
   a clock generator, for providing the predetermined clock signal; and
   a microprocessor for providing the command when the microprocessor determines that the calculation is to be effected on the received serial data.

* * * * *